United States Patent [19]
Gamoh

[11] 4,315,212
[45] Feb. 9, 1982

[54] ELECTRONIC WATTHOUR METER
[75] Inventor: Ryouji Gamoh, Yokohama, Japan
[73] Assignee: Tokyo Shibaura Denki Kabushiki Kaisha, Kawasaki, Japan
[21] Appl. No.: 55,480
[22] Filed: Jul. 6, 1979
[30] Foreign Application Priority Data Jul. 6, 1978 [JP] Japan .................................. 53-82232

[51] Int. Cl.³ ...................... G01R 21/06; G01R 11/16
[52] U.S. Cl. .................................. 324/142; 324/107; 324/111
[58] Field of Search ........................ 324/142, 107, 111

[56] References Cited
U.S. PATENT DOCUMENTS

| | | | |
|---|---|---|---|
| 2,302,474 | 11/1942 | Rich | 324/107 |
| 2,615,063 | 10/1952 | Brown | 324/111 |
| 4,217,545 | 8/1980 | Kusui et al. | 324/142 |

FOREIGN PATENT DOCUMENTS 49-60468 6/1974 Japan .
49-60469 6/1974 Japan .
49-60470 6/1974 Japan .
49-13556 12/1974 Japan .
52-9341 1/1977 Japan .

*Primary Examiner*—Ernest F. Karlsen
*Attorney, Agent, or Firm*—Oblon, Fisher, Spivak, McClelland & Maier

[57] ABSTRACT

An electronic watthour meter comprising: a pulse width modulation circuit for subjecting a voltage signal, proportional to the load voltage of a power supply line, to pulse width modulation to obtain a pulse width duty cycle signal; a multiplication circuit in which a plurality of analog switches are selectively operated, with the aid of the pulse width duty cycle signal, so that positive and negative DC voltages equal in absolute value are obtained from the product of a voltage signal, proportional to the consumption current of the power supply line, and the pulse width duty cycle signal attributing to the voltage signal proportional to the load voltage; and a dual-slope type frequency conversion circuit for converting the positive and negative DC voltages into a frequency signal.

12 Claims, 26 Drawing Figures

ELECTRONIC WATTHOUR METER

BACKGROUND OF THE INVENTION

This invention relates to electronic watthour meters, and more particularly to an electronic watthour meter in which its light load characteristic is improved and its characteristic with time is stablized.

Since an electronic watthour meter has no mechanically movable components, it is excellent in characteristic with time; that is, its accuracy is maintained unchanged for a long period of time. Furthermore, it is advantageous in that its size is relatively small, it is suitable for mass production and the manufacturing cost can be reduced. The watthour meter has a feature that change of a charging rate, as to an integrated power value, or its remote control can be realized by a simple electrical circuit.

Accordingly, it seems that electronic watthour meters will replace induction type watthour meters which are essentially formed with mechanical components. A variety of electronic watthour meters have been proposed in the art.

These conventional electronic watthour meters have an equivalent circuit as shown in FIG. 1. Thus, the watthour meter comprises: a multiplication circuit M in which a voltage signal $e_v$, proportional to the load voltage of the power supply line, and a voltage signal $e_i$, proportional to the consumption current of the supply line, are subjected to multiplication thereby to provide a voltage signal ($e_o = K \cdot e_v \cdot e_i$ where K is the constant) proportional to the instantaneous power of the supply line; and a voltage-to-frequency conversion circuit VF in which the output voltage signal $e_o$, of the multiplication circuit M, is subjected to integration to provide a frequency signal $f_{out}$. Accordingly, the watthour meter obtains an integrated power value by counting the frequency signal $f_{out}$ outputted by the voltage-to-frequency conversion circuit VF.

However, it should be noted that the multiplication circuit M and the voltage-to-frequency conversion circuit VF, of the electronic watthour meter, are made up of operational amplifiers, and therefore an offset voltage is certainly developed, with the result that it affects the accuracy of measurement of the watthour meter, because the accuracy of the watthour meter is expressed by an absolute error with respect to a true measurement value instead of a relative error with respect to the full scale (rating). Accordingly, the accuracy of the watthour meter should be so guaranteed as to be within the absolute error even if the input is 1/30 (3.33%) of the 100% rating or 1/50 (2%). If it is assumed that the rating of the voltage signal $e_i$, corresponding to the consumption current, is 5 V for instance, then the error of 0.5% corresponds to an input 25 mV in conversion value, with the rating being 100%. Therefore, if the input in conversion value is of the order of 25 mV, then the accuracy will not be so seriously affected. However, in the case of 0.5% error (light load) with respect to a 1/50 input, the input in conversion value is 0.5 mV. Accordingly, it is necessary to reduce to less than 0.5 mV the offset voltages induced by the operational amplifiers in the multiplication circuit M and the voltage-to-frequency conversion circuit VF. However, it is considerably difficult to eliminate the offset voltage from the operational amplifier. In addition, the offset voltage is varied with time and temperature. Accordingly, it is difficult to maintain the electronic watthour meter with high accuracy.

SUMMARY OF THE INVENTION

Accordingly, an object of this invention is to provide an electronic watthour meter in which no offset voltage error is caused in operational amplifiers thereof, even with light load, and especially, an offset voltage error, variable with time, is markedly eliminated.

Another object of the invention is to provide an electronic watthour meter in which if its rating is adjusted during the manufacture, then thereafter the inspection and adjustment thereof is unnecessary.

A further object of the invention is to provide an electronic watthour meter the circuit of which is suitable for being manufactured, in the form of an integrated circuit, on a large scale.

A still further object of the invention is to provide an electronic watthour meter in which no operational amplifier is employed in the multiplication section thereof.

A particular object of the invention is to provide an electronic watthour meter in which the voltages of its various circuits are stabilized thereby to improve the accuracy of measurement.

The novel features which are considered characteristic of this invention are set forth in the appended claims. This invention itself, however, as well as other objects and advantages thereof will be best understood by reference to the following detailed description of illustrative embodiments, when read in conjunction with the accompanying drawings.

DETAILED DESCRIPTION OF THE INVENTION

Figure 1:
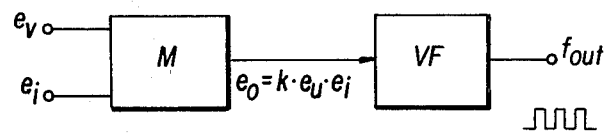
FIG. 1 is a block diagram showing the fundamental arrangement of an electronic watthour meter.
Figure 2:
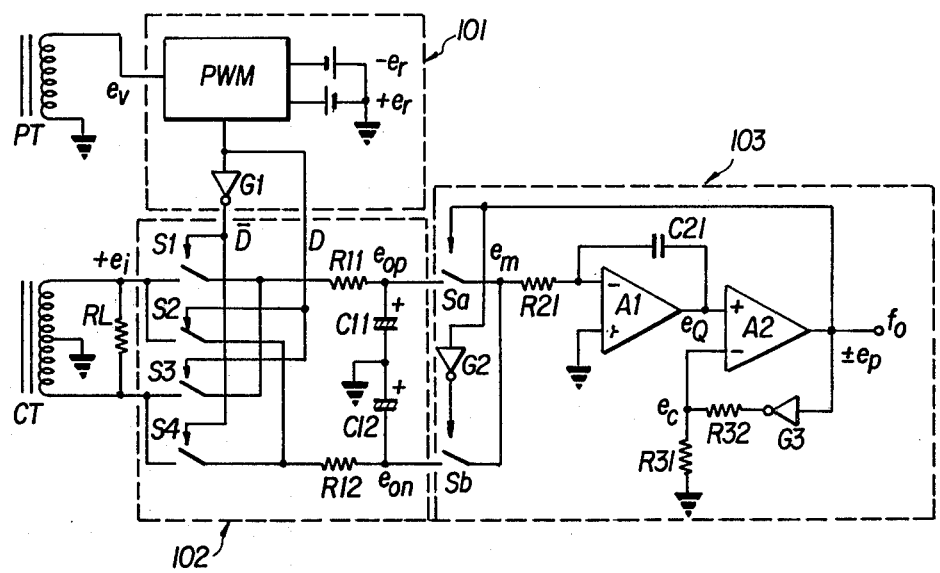
FIG. 2 is a circuit diagram, partly as a block diagram, showing one example of an electronic watthour meter according to the invention.

FIG. 2 is a block diagram showing one example of an electronic watthour meter according to this invention. As conducive to a full understanding of the invention, initially the outline of the invention will be described with reference to FIG. 2, and then the component circuits thereof will be described later.

As shown in FIG. 2, the watthour meter comprises a pulse width modulation circuit 101 in which a voltage signal $e_v$, proportional to a load voltage across power supply lines is detected by a transformer PT, and the voltage signal $e_v$ is subjected to pulse width modulation to output pulse width duty cycle signals D and $\bar{D}$ proportional to the value of the voltage signal $e_v$. The pulse width modulation circuit 101 is provided with a reference voltage source for providing reference voltages $\pm e_r$, and an inverter circuit G1.

A current transformer CT is provided for the power supply lines for load current detection, and the winding of the current transformer CT is shunted by a resistor RL. The center tap of the winding of the current transformer CT is grounded. Voltage signals $\pm e_i$, proportional to the consumption current of the power supply lines, are provided at both ends of the resistor RL, the two signals being equal in amplitude and different by 180° in phase from each other. The voltage signals $\pm e_i$ are applied to a multiplication circuit 102 which comprises analog switches S1 through S4 which are turned on with a logic signal "1" and turned off with a logic signal "0". The analog switches are made up of semiconductor devices such as J-FET's or MOS-FET's. The inputs of the analog switches S1 and S2 are connected to one end of the winding of the current transformer CT, while the inputs of the analog switches S3 and S4 are connected to the other end. The outputs of the analog switches S1 and S3 are commonly connected to a low-pass filter made up of a resistor R11 and a capacitor C11. The outputs of the analog switches S2 and S4 are also commonly connected to a low-pass filter made up of a resistor R12 and a capacitor C12. The resistance of the resistor R11 is equal to that of the resistor R12. The capacitance of the capacitor C11 is equal to that of the capacitor C12.

The voltage signals $\pm e_i$, proportional to the load current of the power supply lines, are applied from the current transformer CT to the multiplication circuit, from which DC voltage signals $e_{op}$ and $e_{on}$, equal in absolute value and opposite in polarity, are outputted through the analog switches S1 through S4, alternately driven by the pulse width duty cycle signals D and $\bar{D}$ of the pulse width modulation circuit 101, and through the low-pass filters. The signal $e_{op}$ or $e_{on}$ is a DC voltage proportional to the product of the voltage signal $e_v$, proportional to the load voltage of the power supply lines, and the voltage signal $e_i$, proportional to the consumption current; that is, it is a DC voltage proportional to the instantaneous power, as described later.

The DC voltage signals $e_{op}$ and $e_{on}$ are applied to a frequency conversion circuit 103 (described later). The frequency conversion circuit 103 comprises analog switches Sa and Sb which are connected to the low-pass filters, respectively. The outputs of the analog switches Sa and Sb are connected through a resistor R21 to one input of an integration circuit A1, constituted by an operational amplifier, the other input of which is grounded. The output of the integration circuit A1 is connected to one input of a comparator circuit A2, constituted by an operational amplifier, which outputs a logic signal "1" or "0" whenever the integration output reaches a predetermined value. The output of the integration circuit A1 is fed back to the input thereof through a capacitor C21. The other input of the comparator circuit A2 is grounded through a resistor R31. The switches Sa and Sb are operated by the output of the comparator circuit A2. The output of the comparator circuit A2 is applied through an inverter G2 to the switch Sb, so that it is opened when the switch Sa is closed and vice versa. Furthermore, the output of the comparator circuit A2 is connected through an inverter G3 and a resistor R32 to the other input thereof.

In FIG. 2, reference character $e_Q$ designates the output voltage of the integration circuit A1; $e_c$, the voltage at the negative input of the comparator circuit A2; and $e_m$, a voltage applied to the negative input of the integration circuit A1 through the switch Sa or Sb.

Thus, the comparator circuit A2 outputs the logic signal "1" or "0" according to the integration output voltage value. When the comparator circuit A2 outputs the logic signal "1", the analog switch Sa is closed to introduce the DC voltage signal $e_{op}$ to the integration circuit A1. When the comparator circuit A2 outputs the logic signal "0", the analog switch Sb is closed to introduce the DC voltage signal $e_{on}$ to the integration circuit A1. Thus, the integration output of the integration circuit A1 is proportional to the DC voltage signal $e_{op}$ or $e_{on}$ (instantaneous power), and the logic signal of the comparator circuit A2 is inverted by the predetermined voltage value of the integration output to form a pulse frequency. Accordingly, a frequency signal f, proportional to the power, can be obtained at the output of the comparator A2.

In FIG. 2, reference character G3 designates an inverter circuit; and R31 and R32, voltage dividing resistors. The resistors R31 and R32 are equal in resistance.

The operation of the watthour meter shown in FIG. 2 will be described.

First, the voltage signal $e_v$ introduced by the transformer PT is converted into the pulse width duty cycle signal D which is proportional to the voltage signal $e_v$ in the pulse width modulation circuit PWM.

Figure 3:
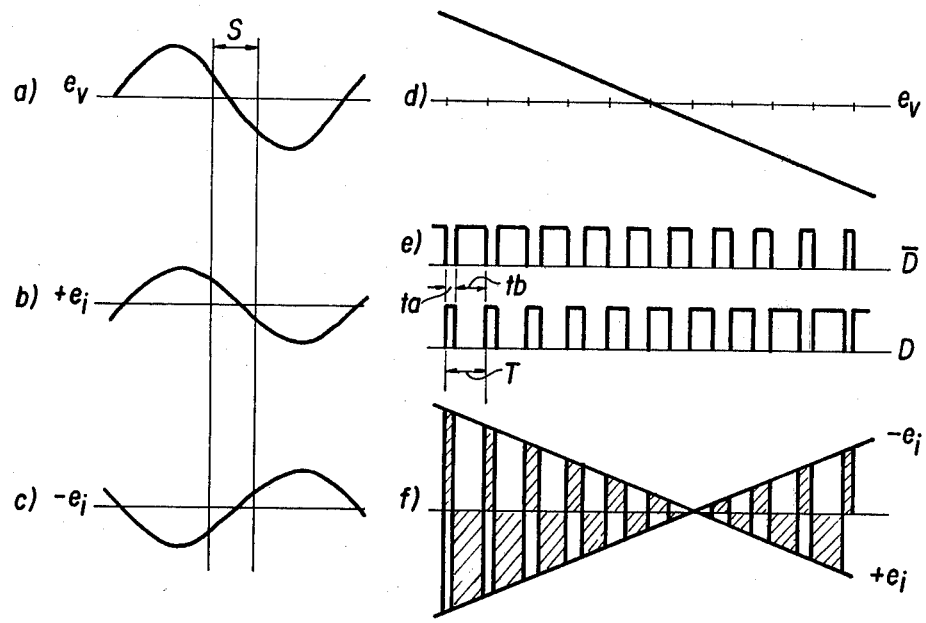
FIG. 3 is a waveform diagram for a description of the operation of a pulse width modulation circuit shown in FIG. 2.

This will become more apparent from waveform diagrams shown in FIG. 3. That is, if a part of the voltage signal $e_v$ for the period S in the part (a) of FIG. 3 is enlarged, then it is as indicated in the part (d) of FIG. 3. In this case, the voltage signals $+e_i$ and $-e_i$ are as indicated in the parts (b) and (c) of FIG. 3. When the voltage signal $e_v$ in the part (d) is subjected to pulse width modulation, then the pulse width duty cycle signals D and $\overline{D}$ as indicated in the part (e) of FIG. 3 can be obtained. If, in the duty cycle signal D, the time width of the interval of the logic signal "1" is represented by ta, and the time width of the interval of the logic signal "0" is represented by tb, then in the pulse width modulation circuit PWM, ta=tb with $e_v$=0, and therefore a 50% duty cycle signal D is obtained. The pulse width is such that ta<tb when the voltage signal $e_v$ is a positive voltage and ta>tb when it is a negative voltage. These pulse width duty cycle signals D and $\overline{D}$ can be expressed as follows:

$$D = \frac{e_r - e_v}{2e_r} = \frac{ta}{T} \quad (1)$$

$$\overline{D} = \frac{e_r + e_v}{2e_r} = \frac{tb}{T} \quad (2)$$

where $e_r$ is the reference voltage of the pulse width modulation circuit PWM.

Among the pulse width duty cycle signal D, thus obtained, and the signal $\overline{D}$, obtained by applying the signal D to the inverter G1, the signal D is used to turn on the analog switches S2 and S3 in the multiplication circuit 102, when it is raised to the logic level "1", and the signal $\overline{D}$ is used to turn on the analog switches S1 and S4 when it is raised to the logic level "1".

Then, the voltage signals $\pm e_i$, proportional to the consumption current of the power supply lines, are introduced by the analog switches S1 through S4 to obtain the DC voltage signals $e_{op}$ and $e_{on}$. That is, the DC voltage signals $e_{op}$ and $e_{on}$, provided by the multiplication of the voltage signals $e_v$ and $e_i$, are obtained by controlling the on-off operations of the analog switches S1 through S4 with the pulse width duty cycle signals D and $\overline{D}$ of the pulse width modulation circuit PWM. The signals $e_{op}$ and $e_{on}$ can be expressed as follows:

$$e_{op} = e_i \cdot \overline{D} + (-e_i) \cdot D \quad (3)$$

$$= e_i \cdot \frac{e_r + e_v}{2e_r} + \left(-e_i \cdot \frac{e_r - e_v}{2e_r}\right)$$

$$= \frac{e_i \cdot e_v}{e_r}$$

$$e_{on} = e_i \cdot D + (-e_i) \cdot \overline{D} \quad (4)$$

$$= e_i \cdot \frac{e_r - e_v}{2e_r} + \left(-e_i \cdot \frac{e_r + e_v}{2e_r}\right)$$

$$= -\frac{e_i \cdot e_v}{e_r}$$

As obvious from the equations (3) and (4), the signals $e_{op}$ and $e_{on}$ are equal in absolute value, and are positive and negative DC voltage signals proportional to the instantaneous power represented by $e_i$ and $e_v$. The equations (3) and (4) can be established only under the condition that R11<<R21. This is to disregard the effects of the switches Sa and Sb.

That is, the average values $e_{on}$ and $e_{op}$, of the voltage signal $-e_i$ and $+e_i$, provided when the switches S1 through S4 are turned on, can be obtained by controlling the on-off operations of the switches S1 through S4 with the pulse width duty cycle signals $\overline{D}$ and D.

Accordingly, the average values $e_{on}$ and $e_{op}$ are similar to the DC voltage values provided according to the equations (3) and (4). This will become more apparent from the part (f) of FIG. 3. That is, in the part (f) of FIG. 3, the average value of the hatched portions corresponds to $e_{on}$, and the average value of the remaining portions corresponds to $e_{op}$.

On the other hand, the analog switches Sa and Sb in the input section of the integration circuit A1 are operated on and off in asynchronization with the on-off operations of the analog switches S1 through S4.

Figure 4:
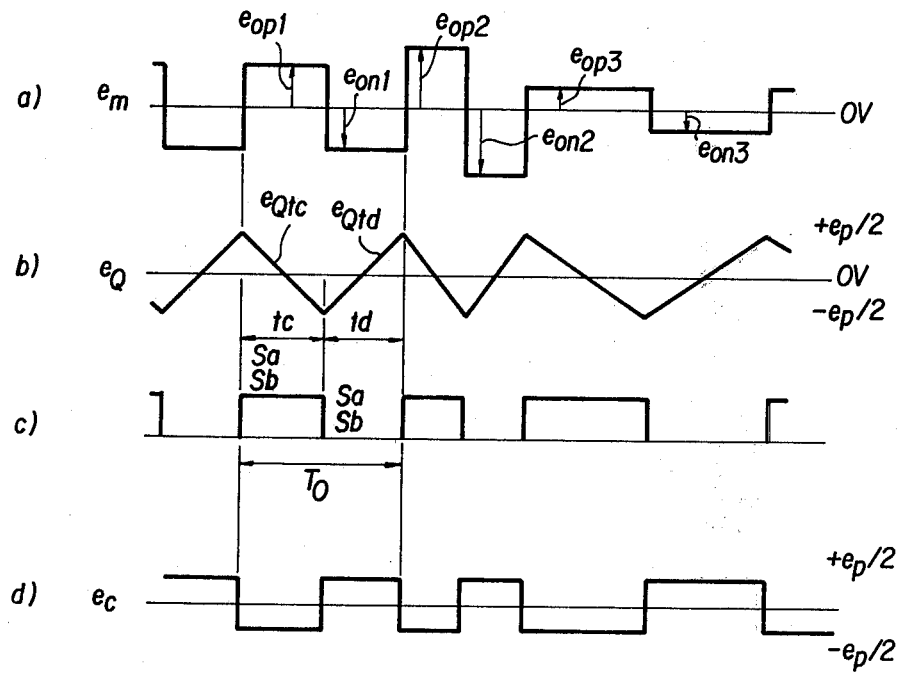
FIG. 4 shows waveforms at various parts of a volage-to-frequency conversion circuit in FIG. 2.

It is assumed that the resistance of the resistor R11 is much smaller than that of the resistor R21 (R11<<R21). When, under this condition, the analog switches Sa and Sb are operated on and off, then the DC voltage signals $e_{op}$ and $e_{on}$ are alternately provided at the common output of the analog switches Sa and Sb; that is, the voltage signal $e_m$ as shown in the part (a) of FIG. 4 is obtained. The voltage signal $e_m$ is converted into a frequency signal fo by the integration circuit A1 and the comparator circuit A2, as described later.

Figure 5:
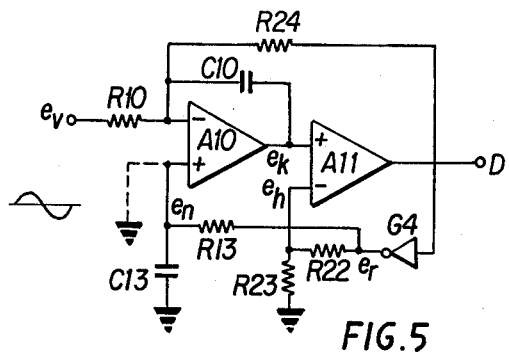
FIG. 5 is a circuit diagram, partly as a block diagram, showing one example of the pulse width modulation circuit of the invention.

Now, the circuits constituting the electronic watthour meter shown in FIG. 2 will be described in detail. The pulse width modulation circuit shown in FIG. 2 is illustrated in FIG. 5 in more detail. Correct electrical energy cannot be obtained without correct pulse width modulation. A conventional pulse width modulation circuit suffers from the offset voltage of the operational amplifier.

In the pulse width modulation circuit shown in FIG. 5, the voltage signal $e_v$ is applied through a resistor R10 to the negative input of an integration circuit A10 formed with an operational amplifier. The output of the integration circuit A10 is applied to the positive input of a comparator circuit A11 formed with an operational amplifier. A capacitor C10 is interposed between the negative input of the integration circuit A10 and the output of the same for input signal integration. The output of the comparator circuit A11 is applied through a resistor R24 to the negative input of the integration circuit A10, and is, on the other hand, applied to an inverter G4. The output of the inverter G4 is subjected to voltage division by resistors R22 and R23, and the resultant signal is applied to the negative input of the comparator circuit A11. The resistance of the resistor R22 is equal to that of the resistor R23. One terminal of the resistor R22 is connected to the negative input of the comparator circuit A11, and the other terminal is connected to the output of the inverter G4. One terminal of the resistor R23 is grounded, and the other terminal is connected to the above-noted one terminal of the resistor R22. Furthermore, the other terminal of the resistor R22 is connected to one terminal of a resistor R13 the other terminal of which is connected to the positive input of the integration circuit A10, the positive input of which is grounded through a capacitor C13. Thus, the resistor R13 and C13 form a low-pass filter.

In FIG. 5, reference character $e_n$ designates the input voltage applied to the positive input of the integration circuit A10; $e_h$, the input voltage applied to the negative input of the comparator circuit A11; and $e_k$, the output voltage of the integration circuit A10.

Now, the case where the low-pass filter is removed from the pulse width modulation circuit thus organized (FIG. 5) and the integration circuit A10 is grounded as indicated by the dotted line, will be described.

The comparator circuit A11 is so designed that it outputs the signal $+e_r$ with the logic signal "1", and the signal $-e_r$ with the logic signal "0".

In order to understand the operation with ease, it is assumed that the voltage signal $e_v=0$, and the logic signal "1" is provided at the output of the comparator circuit A11. In this case, the negative voltage signal $e_h$ obtained by the voltage division of the voltage division resistors R22 and R23 is applied to the negative input of the comparator circuit A11. Furthermore, the positive voltage signal $+e_r$ is applied through the resistor R24 to the negative input of the integration circuit A10. Therefore, the integration circuit A10 carries out integration in a negative gradient mode. When the output voltage $e_k$ of the integration circuit A10 reaches $-e_r/2$, and $e_k \leq e_h$ is established, then the output logical signal "1" of the comparator circuit A11 is changed to "0".

As a result, the voltage signal $e_h$, having a value $+e_r/2$, is applied to the negative input of the comparator circuit A11. Furthermore, the voltage signal $-e_r$ is applied through the resistor R24 to the negative input of the integration circuit A10. Thus, the integration circuit A10 carries out integration in a positive gradient mode. When the integration output voltage $e_k$ reaches $+e_r/2$, and $e_k \geq e_h$ is established, the output logic signal "0" of the comparator circuit A11 is changed to "1". The pulse width modulation circuit PWM carries out self-oscillation in the above-described manner.

Figure 6:
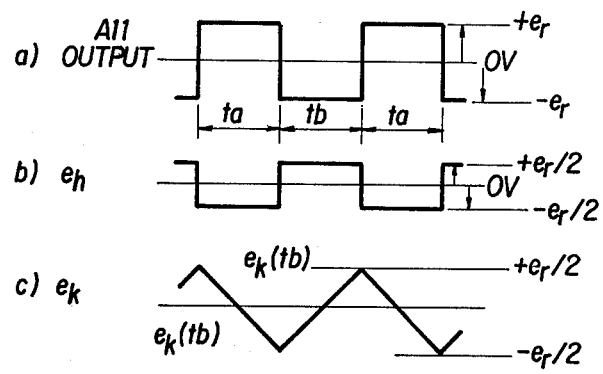
FIG. 6 is a waveform diagram for a description of the operation of the pulse width modulation circuit shown in FIG. 5.

The signals at the various parts of this circuit are as indicated in FIG. 6 which is a waveform diagram. More specifically, the part (a) of FIG. 6 shows the output signal of the comparator circuit A11, the part (b) shows the input signal $e_h$ applied to the negative input of the comparator circuit A11, and the part (c) shows the output signal of the integration circuit A10.

As is clear from FIG. 6, when the voltage signal $e_v$ applied to the negative input of the integration circuit A10 is at 0 volt, then intervals ta and tb of the integration processes become equal to each other, that is, a 50% duty pulse is obtained. Upon application of the voltage signal $e_v$, the addition integration is carried out with the aid of the resistors R10 and R24, and accordingly the pulse width modulation is effected.

With respect to the pulse width modulation circuit, the pulse width duty cycle signals D and $\overline{D}$ will be calculated. If the interval for which the output logic signal of the comparator circuit A11 is at the logic level "1" is represented by ta, and the interval for which it is at the logic level "0" is represented by tb, then the integration output $e_k$ of the integration circuit A10 for the interval ta is:

$$e_k(ta) = -\left( \frac{1}{R10 \cdot C10} \int^{ta} e_v \cdot dt + \frac{1}{R24 \cdot C10} \int^{ta} e_r \cdot dt \right) \quad (5)$$

$$= -\left( \frac{ta}{R10 \cdot C10} e_v + \frac{ta}{R24 \cdot C10} e_r \right)$$

$$= -ta\left( \frac{e_r}{R24 \cdot C10} + \frac{e_v}{R10 \cdot C10} \right)$$

As $e_k(ta)$ is of negative direction integration, then $$e_k(ta) = -e_r \quad (6).$$

From the equations (5) and (6), $$ta\left( \frac{e_r}{R24 \cdot C10} + \frac{e_v}{R10 \cdot C10} \right) = +e_r$$

Accordingly, the interval ta is:

$$ta = \frac{e_r \cdot R10 \cdot R24 \cdot C10}{e_r \cdot R10 + e_v R24} \quad (7)$$

If in this case, R10=R24, then the interval ta can be represented by the following equation (8):

$$ta = \frac{e_r \cdot R10 \cdot C10}{e_r + e_v} \quad (8)$$

On the other hand, the integration output $e_k$ for the other interval tb is:

$$e_k(tb) = -\left( \frac{1}{R10 \cdot C10} \int^{tb} e_v \cdot dt - \frac{1}{R24 \cdot C10} \int^{tb} e_r \cdot dt \right) \quad (9)$$

$$= -\left( \frac{tb}{R10 \cdot C10} e_v - \frac{tb}{R24 \cdot C10} e_r \right)$$

$$= tb\left( \frac{e_r}{R24 \cdot C10} - \frac{e_v}{R10 \cdot C10} \right)$$

As $e_k(tb)$ is of positive direction integration, then $$e_k(tb) = +e_r \quad (10)$$

From the equations (9) and (10), $$tb\left(\frac{e_r}{R24 \cdot C10} - \frac{e_v}{R10 \cdot C10}\right) = e_r$$

Accordingly, the interval tb is represented by the following equation (11).

$$tb = \frac{e_r \cdot R10 \cdot R24 \cdot C10}{e_r \cdot R10 - e_v \cdot R24} \quad (11)$$

If, in this case, R10=R24, then the interval tb can be represented by the following equation (12):

$$tb = \frac{e_r \cdot R10 \cdot C10}{e_r - e_v} \quad (12)$$

The variation ratios of the intervals ta and tb due to the voltage signal $e_v$, i.e., the pulse width duty cycle signals D and $\overline{D}$, can be obtained from the above-described results as follows:

$$D = \frac{ta}{ta+tb} = \quad (13)$$

$$\frac{\left(\frac{e_r \cdot R10 \cdot C10}{e_r + e_v}\right)}{\left(\frac{e_r \cdot R10 \cdot C10}{e_r + e_v}\right) + \left(\frac{e_r \cdot R10 \cdot C10}{e_r - e_v}\right)}$$

$$= \frac{e_r - e_v}{2e_r}$$

$$\overline{D} = \frac{tb}{ta+tb} = \frac{e_r + e_b}{2e_r} \quad (14)$$

That is, the pulse width duty cycle signal D of the circuit PWM is correctly proportional to the input voltage signal $e_v$, and the characteristic of the capacitor C10 is eliminated from the equations (13) and (14). Therefore, the pulse width modulation circuit is theoretically considerably stable. In the pulse width modulation circuit PWM, the voltage signal $e_v$ is proportional to the load voltage of the power supply lines, and it is an AC signal of 50/60 Hz. Therefore, the self-oscillation frequency in the pulse width modulation circuit PWM is so selected as to be sufficiently higher than 50/60 Hz. The self-oscillation frequency is the inverse number of the interval (ta+tb).

However, since an operational amplifier is employed as the integration circuit A10 of the pulse width modulation circuit in practice, the inherent offset voltage of the operational amplifier causes an error in the pulse width duty cycle signals D and $\overline{D}$.

Figure 7:
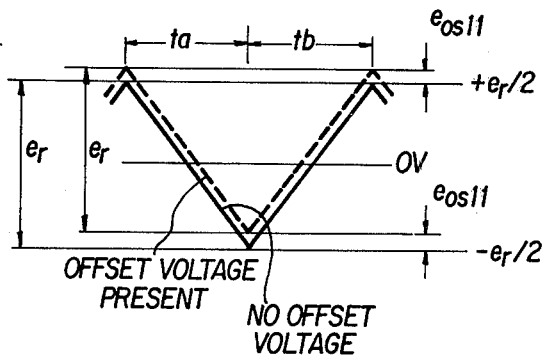
FIG. 7 is an equivalent circuit diagram including the effect of the offset voltage of a comparator circuit in the pulse width modulation circuit in FIG. 5.
Figure 8:
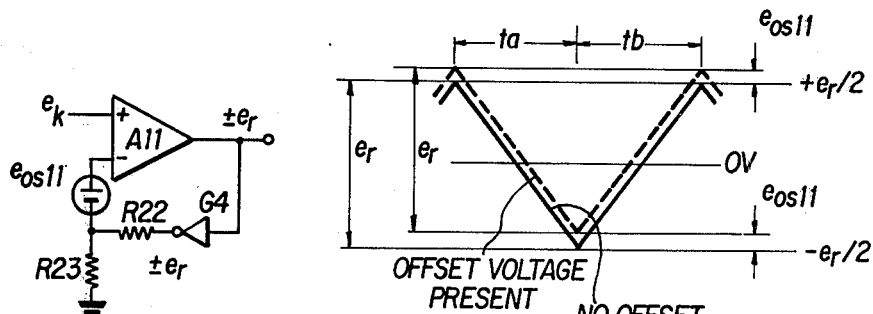
FIG. 8 is a diagram for a description of the effect of the offset voltage of the comparator circuit in the pulse width modulation circuit in FIG. 5.

The fact that the pulse width duty cycle signals D and $\overline{D}$ include such an error will be described. Operational amplifiers are employed as the integration circuit A10 and the comparator circuit A11 in the pulse width modulation circuit as was described before. However, the offset voltage in the comparator circuit A11 causes no error due to the following reason: The equivalent circuit of the comparator circuit A11, including the offset voltage, is as shown in FIG. 7. The offset voltage $e_{os11}$ is provided at the negative input of the comparator circuit A11 as indicated in FIG. 7; however, since the offset voltage, irrespective of its magnitude, is in phase with hysteresis voltage $e_h$ for comparison (FIG. 8), it causes no error which may affect the pulse width duty cycle signals D and $\overline{D}$. FIG. 8 illustrates the output voltage of the comparator circuit. In FIG. 8, the solid line indicates the output voltage in the case where no offset voltage is present, and the broken line indicates the output voltage in the case where the offset voltage is present. In each of the cases, the voltage width is $e_r$, and the values of the time widths ta and tb are maintained unchanged, irrespective of the presence or absence of the offset voltage.

As the offset voltage of the integration circuit A10 is, on the other hand, added in series to the voltage signal $e_v$, errors are caused as indicated in the following equations:

In the case of the equations (8) and (12), $$ta = \frac{e_r \cdot R10 \cdot C10}{e_r + e_v - 2e_{os10}} \quad (15)$$

$$tb = \frac{e_r \cdot R10 \cdot C10}{e_r - e_v + 2e_{os10}} \quad (16)$$

Accordingly, the duty cycle signals D and $\overline{D}$ are:

$$D = \frac{e_r - e_v + 2e_{os10}}{2e_r} \quad (17)$$

$$\overline{D} = \frac{e_r - e_v - 2e_{os10}}{2e_r} \quad (18)$$

Accordingly, it is necessary to provide an adjusting circuit in order to adjust to zero the offset voltage $e_{os10}$ appearing in the equations (17) and (18). Furthermore, in order to prevent the effects of temperature drift and variation with time, it is necessary to use operational amplifiers less in offset drift. However, such means are undesirable in that the operational amplifiers become expensive, and it also takes time to adjust the offset voltage, with the result that the reliability is lowered.

In the pulse width modulation circuit in FIG. 5, the low-pass filter formed with the resistor R13 and the capacitor C13 is provided between the positive input of the integration circuit A10 and the output of the inverter G4 connected to the comparator A11. A voltage $e_n$ obtained by smoothing the output voltage of the inverter G4 with the low-pass filter is:

$$e_n = \overline{\Sigma ta\,(-e_r) + \Sigma tb\,(e_r)} \quad (19)$$

where the symbol (−) represents the average value. The output of the inverter circuit G4 is $+e_r$ with the logic signal "1", and $-e_r$ with the logic signal "0". These outputs are equal in amplitude but opposite in polarity. Being an AC signal, the supplied voltage signal $e_v$ includes no DC offset voltage. Therefore, the infinite integration value is zero. Therefore, if the time constant of the low-pass filter, made up of the resistor R13 and the capacitor C13, is made much larger than the frequency of the voltage signal $e_v$, to zero the offset voltage $e_{os10}$ of the integration circuit A10, the $\Sigma ta = \Sigma tb$, and $e_n$ becomes zero volt. If the offset voltage $e_{os10}$ is positive, $\Sigma ta \leq \Sigma tb$, and the voltage $e_n$ provides a positive voltage proportional to the magnitude of the offset voltage $e_{os10}$. Accordingly, $e_{os10} \simeq e_n$ can be established by suitably selecting the amplitude of the output voltage of the inverter circuit G4. In the equations (15) and (16), representing the characteristic of the pulse width modulation circuit PWM, the offset voltage $e_{os10}$, of the integration circuit A10, is modeled at the negative input of the integration circuit A10. Therefore, if the voltage $e_n$, equal to the offset voltage $e_{os10}$, is fed back to the positive input of the integration circuit A10, then the offset voltage $e_{os10}$ of the integration circuit A10 is practically cancelled.

As is clear from the above description, in the pulse width modulation circuit in FIG. 5, the offset voltage $e_{os10}$ of the integration circuit A10 can be corrected by the provision of the low-pass filter feedback circuit. Thus, it is possible to use means such as operational amplifiers, useful for various objects and low in cost, to reduce the manufacturing cost and to prevent the effect of the offset voltage. Furthermore, the use of operational amplifiers is considerably effective for manufacturing the pulse width modulation circuit in the form of an integrated circuit, and for eliminating the necessity of externally adjusting the offset voltage. In addition, as the feedback is effected with the aid of the time constant of the resistor R13 and the capacitor C13, the offset voltage can be automatically adjusted after the delay of the time constant (seconds) due to the variation with time or the temperature variation. Thus, the pulse width modulation circuit is high in stability for a long period of time, and with the pulse width modulation circuit the measurement can be carried out with high accuracy.

The voltage-frequency conversion circuit employed in this invention will be described.

The arrangement and operation of the frequency conversion circuit 103 shown in FIG. 2 have already been described briefly. Now, the operation of the frequency conversion circuit 103 will be described in more detail.

In the case where the switch Sa is turned on in the interval tc and the switch Sb is turned on in the interval td, by the output logic signal of the comparator circuit A2, signals $e_{op1}$, $e_{on1}$, $e_{op2}$, $e_{on2}$, ... are supplied as the voltage signal $e_m$ to the integration circuit A1 as indicated in the part (a) of FIG. 4. The voltage signal $e_m$ is subjected to integration in the integration circuit A1, the integration output $e_Q$ (the part (b) of FIG. 4) of which is applied to one input of the comparator circuit A2. A voltage signal $e_c$ is applied to the other input of the comparator circuit A2, for comparison. The voltage signal $e_c$ is $-e_p/2$ in the interval tc and $+e_p/2$ in the interval td, as indicated in the part (d) of FIG. 4. As the integration circuit A1 receives the positive DC voltage signal $e_{op}$ in the interval tc, it shows the down characteristic. When the integration output $e_Q$ reaches $-e_p/2$, the output logic signal of the comparator circuit A2 is inverted, and it becomes the interval td. In the interval td, the negative DC voltage signal $e_{on}$ is applied to the integration circuit A1, and therefore the integration output $e_Q$ of the integration circuit A1 is increased. When the integration output $e_Q$ reaches $+e_p/2$, the output logic signal of the comparator circuit A2 is inverted, and the interval tc is provided again. In this connection, it should be noted that the part (c) of FIG. 4 indicates the on-off states of the switches Sa and Sb.

Accordingly, the inversion period To of the comparator circuit A2 is:

$$To = tc + td = \frac{e_p \cdot R2 \cdot C2}{e_{op}} - \frac{e_p \cdot R2 \cdot C2}{e_{on}} \quad (20)$$

If $e_{op}$ and $e_{on}$ of the equations (3) and (4) are substituted into the equation (20), then $$To = \frac{2e_p \cdot e_r \cdot R2 \cdot C2}{e_i \cdot e_v}.$$

Therefore, a frequency signal fo as indicated by the following equation (21) is obtained at the output of the comparator circuit A2:

$$fo = \frac{e_i \cdot e_v}{2e_p \cdot e_r \cdot R2 \cdot C2} \quad (21)$$

Since $e_p$ and $e_r$ are constant reference voltages, the frequency signal fo has a value that is proportional to the consumption power ($e_i \cdot e_v$) of the supply lines. An integrated power value can be obtained by counting the value.

The frequency conversion circuit of the electronic watthour meter, according to the invention, will be compared with a conventional converter, with respect to the offset voltage. A conventional frequency conversion circuit is as shown in the part (a) of FIG. 9. In the conversion circuit, a polarity sign inversion circuit A0 is provided in the front stage of an integration circuit A1 for realizing a dual-slop characteristic. The inversion circuit A0 is provided to obtain a signal $-e_{op}$. Signals $\pm e_{op}$ are applied to the integration circuit A15 by the switching operation of a switch SW. In the part (a) of FIG. 9, reference character A16 designates a comparator circuit. Accordingly, the polarity sign inversion circuit A0 needs an operational amplifier, and suffers from the inherent offset voltage of the operational amplifier at the time of light load (i.e., when the level of the input signal $e_{op}$ is low). The offset voltage causes a large measurement error with a watthour meter for which, instead of the full-scale accuracy, the measurement accuracy is important.

In the watthour meter according to the invention, on the other hand, the signals $e_{op}$ and $e_{on}$, equal in absolute value and oppositive in polarity sign, are obtained in the process of multiplication of $e_v$ and $e_i$, and therefore error is scarcely caused even at the time of light load.

In the multiplication circuit in the example of the electronic watthour meter according to the invention, shown in FIG. 2, the DC voltage signals $e_{op}$ and $e_{on}$ of the equations (3) and (4), the inversion period To of the comparator circuit A2 of equation (20), and the frequency signal fo of the equation (21) are established only when the resistors R11 and R21 meet the condition R11<<R21, as was described before. Therefore, by taking the values of the resistors R11 and R21 into account, $$e_{op} = e_i(\overline{D}) \cdot \frac{R11}{R11 + R21} = \frac{(e_i - e_{op})\overline{D}}{R11//R21} . \quad (22)$$

This equation (22) means that when high linearity is more than 0.05%, $R2 \geq 1000R1$. Accordingly, if the resistance of the resistor R11 is, for instance, of the order of 10 KΩ, then the resistance of the resistor R21 is higher than 10 MΩ, and therefore it is difficult to obtain the resistor high instability. This difficulty may be eliminated by reducing the resistance of the resistor R11. However, this method is disadvantageous in that since the voltage signals $e_i$ and $e_v$ are AC signals of commercial frequency (50/60 Hz), it is necessary to provide a low-pass filter having a considerably large time constant (R1·C1), and therefore the reduction of the resistance of the resistor R11 is limited.

Figure 10:
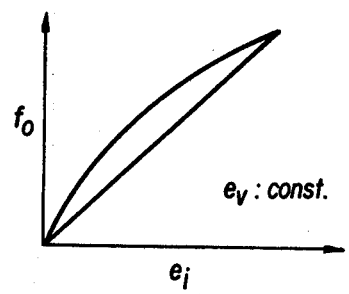
FIG. 10 is a graphical representation indicating the input-output characteristic of the multiplication circuit obtained when the circuit constants of the circuit shown in FIG. 2 are not in a predetermined relation.

When the condition R11<<R21 is not satisfied, then the second term in the equation (22) shows a secondary characteristic, and therefore the input-output characteristic of the multiplication circuit is in a saturation mode, as shown in FIG. 10, in which the upper curve is an actual $e_i - fo$ characteristic curve, and the lower curve is the ideal characteristic curve, with $e_v$ being constant. Accordingly, the above-described nonlinearity affects the multiplication circuit and a pulse counting section connected to the output of the frequency conversion circuit, and therefore, it is difficult to measure electrical energy with high accuracy.

Figure 9A:
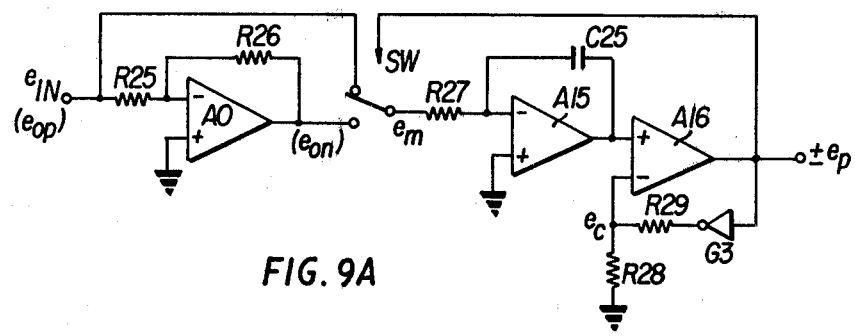
FIG. 9A is a circuit diagram showing the arrangement of a conventional voltage-to-frequency conversion circuit.
Figure 9B:
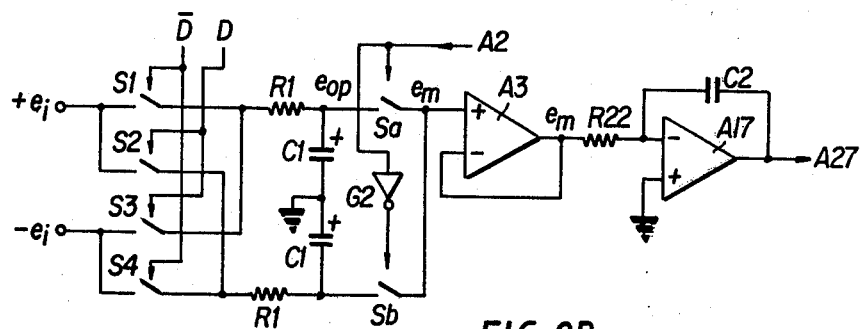
FIG. 9B is a circuit diagram showing apparatus for overcoming nonlinearity.

The effect of the nonlinearity may be overcome by providing an impedance converting operational amplifier A3 in the front stage of an integration circuit A17 as shown in the part (b) of FIG. 9. However, addition of the operational amplifier A3 increases the manufacturing cost, and the offset voltage of the operational amplifier A3 provides another problem at the time of light load. Even if the offset voltage of the operational amplifier A3 is externally adjusted, problems such as variations with time and temperature variations still exist. In practice, it is necessary to use an expensive operational amplifier low in drift.

Figure 11:
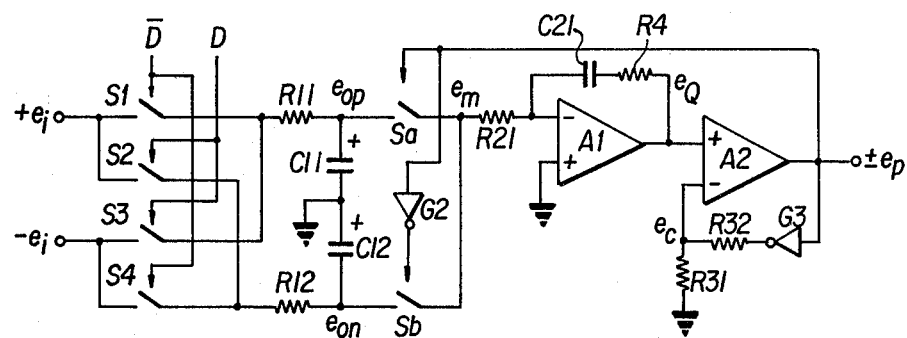
FIG. 11 is a circuit diagram, partly as a block diagram, showing a voltage-to-frequency circuit in another example of the electronic watthour meter according to the invention.

In order to overcome the above-described difficulties and to improve the linearity and accuracy, another example of the electronic watthour meter, according to the invention, is a frequency conversion section as shown in FIG. 11.

In this frequency conversion section, the above-described operational amplifier A3 is not provided in the front stage of an integration circuit A1, and instead a linearity correcting resistor R4 is provided in the feedback system, extended from the output of the integration circuit A1 to the negative input of the same, for linearity correction. In other words, the nonlinearity caused by a resistor R11 in a low-pass filter and a resistr R21 connected to an integration circuit is corrected thereby to make the input-output characteristic linear. A series of operations for obtaining DC voltage signals $e_{op}$ and $e_{on}$, proportional to power, equal in absolute value and opposite in polarity and providing the concerned frequency are similar to those in FIG. 2. Accordingly, only the effects of providing the linearity correcting resistor R4 will be described.

Figure 12:
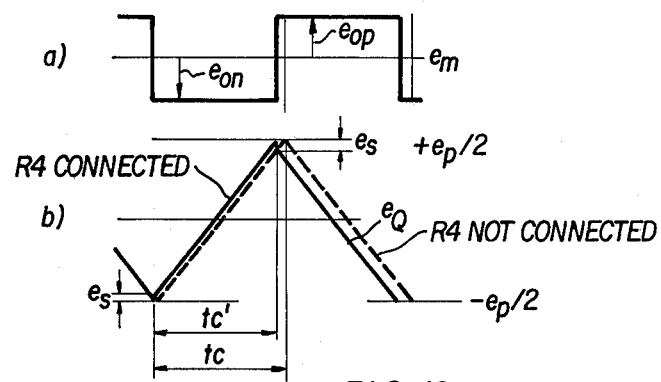
FIG. 12 is a diagram showing waveforms at particular parts in the circuit shown in FIG. 11.

The parts (a) and (b) of FIG. 12 are diagrams indicating the input voltage $e_m$ and the output voltage $e_Q$ of the integration circuit A1 with the linearity correcting resistor R4 connected thereto, respectively. When the resistor R4 is not connected, the integration output characteristic is as indicated by the broken line. With the resistor R4 connected, the output voltage jumps as much as $e_s$ when the analog Sa and Sb are switched. The amplitude of this jump is:

$$e_s = e_m \cdot (R4/R2) \quad (23)$$

Figure 13:
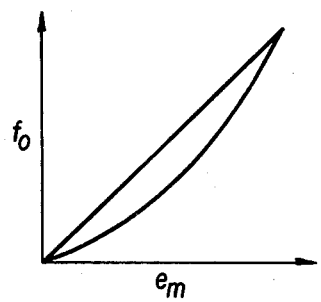
FIG. 13 is a graphical representation indicating the input-output characteristic of the voltage-to-frequency conversion circuit shown in FIG. 11.

Therefore, it is proportional to the multiplication value DC voltage signal $e_{op}$ or $e_{on}$. Accordingly, the integration process of the integration circuit A1 is reduced by the jump voltage $e_s$. Thus, when the resistor R4 is connected, the output frequency characteristic of the frequency conversion section, as shown in FIG. 13, is completely opposite to the characteristic shown in FIG. 10. In FIG. 13, the upper curve is the ideal $e_m - fo$ characteristic curve, and the lower curve is the actual $e_m - fo$ characteristic curve.

Thus, if the values of resistors R11, R21 and R4 and a capacitor C21 are suitably selected in the circuit in FIG. 11, then the error concerning the multiplication circuit is cancelled, and a frequency signal, having the ideal characteristic proportional to the values $e_i$ and $e_v$, can be obtained.

Similarly, as in the pulse width modulation ciruit, operational amplifiers are employed as the integration circuit A1 and the comparator circuit in the frequency conversion section also. Therefore, the offset voltages of the amplifiers cause output errors, which present problems at the time of light load. However, as was described with reference to FIGS. 7 and 8, the offset voltage of the comparator circuit A2 causes no error. This is obvious from FIGS. 14 and 15 which are similar to FIGS. 7 and 8. That is, the offset voltage $e_{os2}$ of the comparator circuit A2 is merely in phase with a hysteresis voltage $e_c$, which is a reference voltage for comparison, and it does not affect in any manner the output in the intervals tc and td in which the frequency is determined.

The offset voltage $e_{os1}$ of the integration circuit A1 is supplied in series with the DC voltage signals $e_{op}$ and $e_{on}$, and therefore it causes errors. The effects of the offset voltage of the integration circuit A1 will be described with reference to FIG. 2 (or FIG. 12) and FIG. 4.

The integration output $e_Q(tc)$ in the interval tc is:

$$e_Q(tc) = -\left\{ \frac{1}{R2 \cdot C2} \int^{tc} (e_{op} + e_{os1}) \, dt \right\} = -e_p$$

$$= tc \left( \frac{e_{op} + e_{os1}}{R2 \cdot C2} \right)$$

Therefore, $$tc = \frac{e_p \cdot R2 \cdot C2}{e_{op} + e_{os1}} \quad (24)$$

The integration output $e_Q(td)$ in the interval td is:

$$e_Q(td) = \left\{ \frac{1}{R2 \cdot C2} \int^{td} (-e_{on} + e_{os2}) \right\} = -e_p$$

$$= td \left( \frac{e_{on} - e_{os1}}{R2 \cdot C2} \right)$$

Therefore, $$td = \frac{e_p \cdot R2 \cdot C2}{e_{on} - e_{os1}} \quad (25)$$

Accordingly, the period To is:

$$To = \frac{2e_{op} \cdot e_p \cdot R2 \cdot C2}{(e_{op}^2 - e_{os1}^2)}$$

From this, the frequency fo is:

$$fo = \frac{e_{op}^2 - e_{os1}^2}{2e_{op} \cdot e_p \cdot R2 \cdot C2} \quad (26)$$

With the DC voltage signal $e_{op}$ as the value of multiplication of $e_i$ and $e_v$, the equation (26) can be rewritten as follows:

$$fo = \frac{(Ke_i \cdot e_v)^2 - e_{os1}^2}{2K \cdot e_i \cdot e_v \cdot e_p \cdot R2 \cdot C2} \quad (27)$$

where K is the constant.

If the offset voltage $e_{os1}$ of the integration circuit A1 is zero ($e_{os1}=0$), from the equation (27):

$$fo' = \frac{K \cdot e_i \cdot e_v}{2e_p \cdot R2 \cdot C2} \quad (28)$$

The ideal output frequency is obtained. In the case of $(K \cdot e_i e_v) >> e_{os1}$, a quadratic equation is obtain, and therefore the error can be very small. However, when the load is light, the value $(K \cdot e_i e_v)$ is sometimes small. In this case, because of the characteristic of the equation (27), it is impossible to avoid the effect of errors, due to the offset voltage $e_{os1}$, even in the frequency conversion circuit shown in FIG. 2 or 11.

In order to eliminate the effect of the offset voltage and to carry out the measurement with high accuracy, another example of the frequency conversion section in the electronic watthour meter, according to the invention, will be described with reference to FIG. 16. In this frequency conversion section, a low-pass filter made up of a resistor R5 and a capacitor C3 is connected between the positive input of an integration circuit A1 and an inverter circuit G3 (the positive input not being grounded directly). A voltage $e_f$, obtained by smoothing the output voltage of the inverter circuit G3 with the low-pass filter R5 and C3, can be calculated as follows:

$$ef = \frac{}{tc(-e_p) + td(e_p)} \quad (29)$$

The inverter circuit G3 outputs a signal $+e_p$ with the logic signal "1" and a signal $-e_p$ with the logic signal "0". The signals $\pm e_p$ are equal in amplitude and opposite in polarity. The DC voltage signals $e_{op}$ and $e_{on}$, introduced to the integration circuit A1, are also equal in absolute value and opposite in polarity. If the offset voltage $e_{os1}$ of the integration circuit A1 is zero, then as a result of the equations (24) and (25) tc=td, and the voltage $e_f$ is zero. If the offset voltage $e_{os1}$ is positive, then tc<td and the voltage $e_f$ is a positive voltage. In the case when the offset voltage $e_{os1}$ is negative, then tc>td and the voltage $e_f$ is a negative voltage. Accordingly, $e_{os1} \approx e_f$ can be obtained by suitably selecting the output level (amplitude of $e_p$) of the inverter circuit G3.

Figure 14:
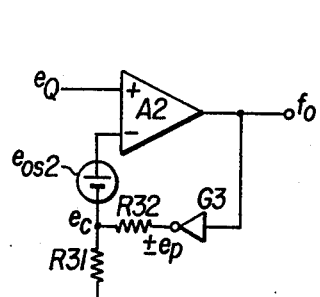
FIG. 14 is an equivalent circuit diagram including the effect of the offset voltage of a comparator circuit in the voltage-to-frequency conversion circuit in FIG. 11.
Figure 15:
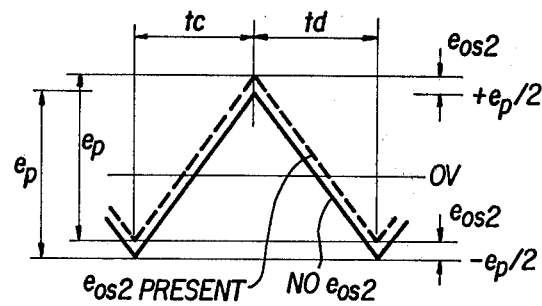
FIG. 15 is a diagram for a description of the effect of the offset voltage of the comparator circuit in the voltage-to-frequency conversion circuit.

With respect to the equations (24) and (25) expressing the integration characteristic, the offset voltage $e_{os1}$ is modeled at the negative input of the integration circuit A1 (compare FIG. 14). Therefore, if the voltage $e_f$, equal to the voltage $e_{os1}$, after being smoothed by the low-pass filter, made up of the resistor R5 and the capacitor C3, is applied to the positive input of the integration circuit A1, then the offset voltage $e_{os1}$ can be practically cancelled.

Figure 16:
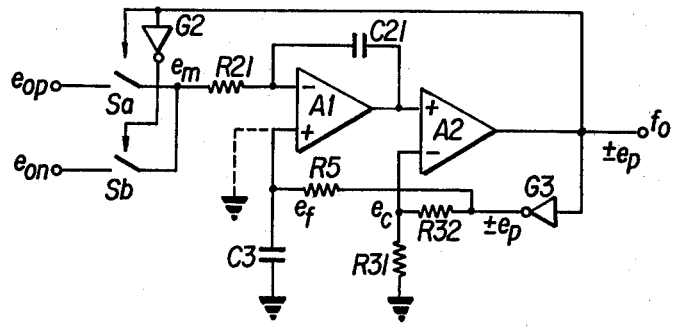
FIGS. 16 and 17 are circuit diagrams, partly as block diagrams, showing voltage-to-frequency conversion circuits in third and fourth examples of the electronic watthour meter according to the invention, respectively.

As is apparent from the above description, in the frequency conversion section shown in FIG. 16, the offset voltage of the integration circuit A1, comprising an operational amplifier, can be corrected merely by providing the feedback circuit, i.e., the low-pass circuit. Accordingly, the use of an operational amplifier, useful for various objects and low in cost, makes it possible to eliminate the effect of the offset voltage and to manufacture the frequency conversion section in the form of an integrated circuit. Furthermore, for the same reason, it is unnecessary to externally adjust the offset voltage. In addition, the feedback is effected on the basis of the time constant of the resistor R5 and the capacitor C3. Therefore, even with time and temperature variations, the offset voltage is automatically adjusted after the delay of the time constant (seconds), and therefore the frequency conversion section can be maintained stable for a long period of time.

Figure 17:
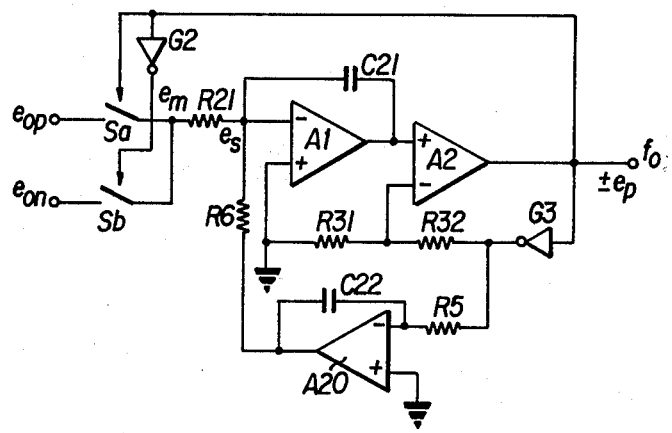

Shown in FIG. 17 is another example of the frequency conversion circuit of the electronic watthour meter according to the invention. In the frequency conversion circuit in FIG. 16, the output of the inverter circuit G3 is fed back to the positive input of the integration circuit A1. On the other hand, in the frequency conversion circuit in FIG. 17, the output of an inverter circuit G3 is fed back to the negative input of an integration circuit A1 through another integration circuit A20. The output of the inverter circuit G3 is applied through a resistor R5 to the negative input of the integration circuit A20. The positive input of the integration circuit A20 is grounded. A capacitor C22 is connected between the output of the integration circuit A20 and the negative input. The output of the integration circuit A20 is connected through a resistor R6 to the negative input of the integration circuit A1.

The output of a comparator circuit A2 is fed back to the negative input of the integration circuit A1 through the integration circuit A20 as described above. This is to eliminate an offset voltage included in an input voltage $|e_{op}|$ or $|e_{on}|$. In the frequency conversion circuit shown in FIG. 16, the offset voltage of the integration circuit A1 may be compensated for, but it is impossible to completely eliminate the offset voltage included in the input voltage $|e_{op}|$ or $|e_{on}|$. The input voltage included in the input voltage $e_{op}$ or $e_{on}$ attributes to the on-off operations of the switches S1 through S4 in the multiplication circuit and of the switches Sa and Sb, and therefore the value $e_{op}$ may be deviated from the value $e_{on}$ by the offset voltage. Because of this, the output of the integration circuit A20 is fed back to the negative input of the integration circuit A1, to set the voltage $e_s$, at the negative input of the integration circuit A1, to 0 volt. Thus, the offset voltage included in the input voltage $|e_{op}|$ or $|e_{on}|$ can be compensated for.

Stabilization of the output voltage of the comparator circuit will now be described. The comparator circuit has been described with respect to FIG. 2 or FIG. 5. The output of the comparator must have the value $+e_p$ or $+e_r$ with the logic signal "1", and the value $-e_p$ or $-e_r$ with the logic signal "0".

Figure 18:
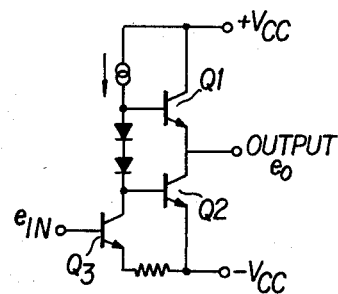
FIG. 18 and FIG. 19 are diagrams showing the output circuits of a conventional comparator circuit, respectively.

In general, the output circuit of a comparator circuit of this type is formed with a bipolar IC as shown in FIG. 18. In FIG. 18, reference character $e_{in}$ is a signal obtained by converting a differential input. When a transistor Q3 is rendered conductive (on) by the signal $e_{in}$, a transistor Q2 is also rendered conductive to output a voltage of about $-Vee$. When, on the other hand, the transistor Q3 is nonconductive, a transistor Q1 is conductive to output a voltage of about $+Vee$.

In such a circuit, the saturation voltages of the transistors Q1 and Q2 are limited. Especially, an offset voltage of about 2 V is developed in the transistor Q2. Therefore, in the case where a $\pm 15$ V electric source is employed for instance, the output voltage is about 14.5 V with the logical signal "1", and about $-13$ V with the logic signal "0".

Figure 19:
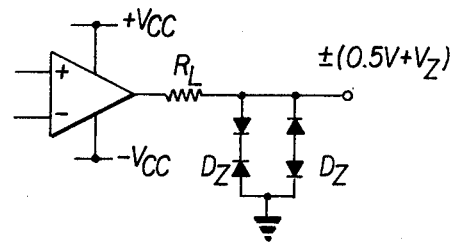

In order to overcome this difficulty, a method may be employed in which, as shown in FIG. 19, Zener diodes Dz are connected to the output of the comparator circuit to clamp the output voltage and thereby stabilize the amplitude of the output voltage.

However, with this method, it is difficult to maintain the amplitudes of the positive and negative output voltages at an equal level because the Zener diodes Dz and fluctuated in Zener voltage.

Figure 20:
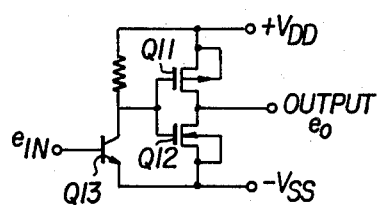
FIG. 20 is a circuit diagram showing the output circuit of the comparator circuit in the electronic watthour meter according to the invention.

In order to solve this problem, the output circuit of the comparator circuit is formed with a C-MOS circuit in each example of the electronic watthour meter of the invention. As seen in FIG. 20, reference characters Q11 and Q12 are enhancement MOS type field-effect transistors. The transistor Q11 is a P-channel type field-effect transistor, while the transistor Q12 is an N-channel type field-effect transistor. In this circuit, when a transistor Q13 is rendered conductive, the P-channel type field-effect transistor is rendered conductive, and when the transistor Q13 is rendered nonconductive, the N-channel type field-effect transistor Q12 is rendered conductive.

Figure 21:
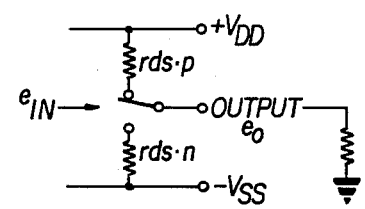
FIG. 21 shows an equivalent circuit of the circuit illustrated in FIG. 20.

The novel feature of the circuit resides in that, since the field-effect transistors Q11 and Q12 are voltage-controlled elements, no offset voltage is substantially developed. Therefore, an equivalent circuit, as shown in FIG. 21, can be obtained by replacing the circuit of FIG. 20 with a resistance circuit. In general, each of the MOS type field-effect transistors Q11 and Q12 shows several tens of ohms to several hundreds of ohms ($\Omega$) when rendered conductive, and shows a high resistance value of several thousands of megohms (M$\Omega$). Accordingly, the circuit in FIG. 20 can be replaced by a switching circuit as shown in FIG. 21. Therefore, the amplitude of the output voltage of the comparator circuit, using the C-MOS type field-effect transistors Q11 and Q12, can be expressed by the following equation (30) with the output logic signal "1", and the following equation (31) with the output logic signal "0":

$$e_{OH} = V_{DD}\frac{RL}{RL + rds \cdot p} \quad (30)$$

$$e_{OL} = V_{SS}\frac{RL}{RL + rds \cdot n} \quad (31)$$

where $e_{OH}$ is the output $e_O$ at the high level and $e_{OL}$ is the output $e_O$ at the low level. In FIG. 21, reference characters rds·p and rds·n designates the resistances of the field-effect transistors Q11 and Q12, respectively, and the reference character $R_L$ is the load resistance. Accordingly, if the supply voltage $V_{DD}$ is made to be equal to the supply voltage $-V_{SS}$ and the switch-on resistance of the field-effect transistor Q11 is made to be equal to that of the field-effect transistor Q12, then it is possible to make the value (the absolute value of the amplitude) $e_{OH}$ equal to the value $e_{OL}$. Thus, the above-described output voltages $+e_p$ and $+e_r$ of the comparator circuit, can be correctly obtained by the circuitry shown in FIG. 20.

Stabilization of the output of the inverter circuit will now be described.

Figure 22:
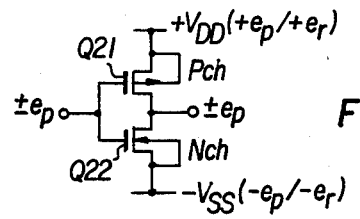
FIG. 22 is a circuit diagram showing an inverter circuit formed with C-MOS type field-effect transistors in the electronic watthour meter according to the invention.

The inverter circuit shown in FIG. 22, similar to the comparator circuit shown in FIG. 20, is formed with C-MOS type field-effect transistors Q21 and Q22. When a voltage $+e_p$ is applied to the input of a circuit, the N-channel type field-effect transistor Q22 is rendered conductive to output a signal $-e_p$. When a voltage $-e_p$ is applied to the input of the circuit, the P-channel type field-effect transistor Q21 is rendered conductive to output a signal $+e_p$. The output voltages, which are obtained by inverting the input voltages, can be correctly obtained by making the switch-on resistances of the field-effect transistors Q21 and Q22 equal to each other.

As is apparent from the above description, the output circuit of the comparator circuit and the inverter circuit are formed with C-MOS type field-effect transistors, the saturation "on" resistance of the P-channel type field-effect transistor, connected to the electric source $+V_{DD}$, is made to be equal to that of the N-channel type field-effect transistor connected to the electric source $-V_{SS}$. Moreover, electric sources $+V_{DD}$ and $-V_{SS}$ are made to be equal in amplitude and high in stability for driving the transistors. Therefore, the predetermined voltage outputs can be obtained with high accuracy.

Figure 23:
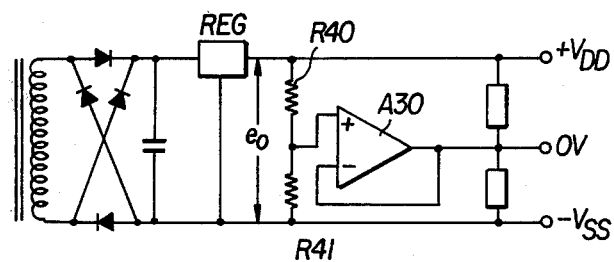
FIG. 23 is a circuit diagram showing an electronic source unit employed in the electronic watthour meter according to the invention.

FIG. 23 shows an electric source unit for driving the various sections of the electronic watthour meter.

In the electronic watthour meter, the electric sources $+V_{DD}$ and $-V_{SS}$ are employed, as they are, as the reference voltages $e_p$ and $e_r$. Accordingly, it is necessary to provide positive and negative electric sources equal in voltage amplitude because of the characteristic of the reference voltages $e_p$ and $e_r$.

As the total current consumed in the electronic watthour meter of the invention is of the order of several milliamperes (mA), the electric source, completely subjected to tracking, as shown in FIG. 23 is employed in the watthour meter. In FIG. 23, reference character REG designates a positive voltage regulator. The output voltage $e_o$ of the regulator REG is so selected as to meet the following equation:

$$e_o = +V_{DD} - (-V_{SS})$$

The mid-point voltage 0 V is determined by resistors R40 and R41 and an impedance converting buffer amplifier A30. Accordingly, in order to provide ±12 V as electric sources, for instance, it is necessary to provide a 24 V regulator and to make the resistance of the resistor R40 equal to that of the resistor R41 (R40=R41). An operational amplifier is employed as the buffer amplifier A30. Because of the arrangement of the circuit shown in FIG. 23, the operational amplifier has an infinite input impedance, and a substantially zero output impedance. Therefore, the input voltage $e_z$ of the buffer amplifier A30 is:

$$e_z = e_o\frac{R40}{R40 + R41} \quad (32)$$

This value shows the mid-point voltage 0 V of the circuit. Accordingly, in the case where the output voltage of the buffer amplifier A30 is 0 V, $$+V_{DD} = e_o\frac{R40}{R40 + R41} \quad (33)$$

$$-V_{DD} = e_o\frac{R40}{R40 + R41} \quad (34)$$

Therefore, $|V_{DD}| = |V_{SS}|$ Accordingly, in this electric source unit, the variation of the output voltage $e_o$ of the regulator REG is uniformly distributed to the voltages $+V_{DD}$ and $-V_{SS}$. Thus, the electric source unit serves as a completely tracked electric source unit.

In the watthour meter described above, each pulse width modulation circuit and frequency conversion section employs the integration circuit, the comparator circuit including the output buffer utilizing C-MOS type field-effect transistors, and the analog switches S1 through S4 and Sa and Sb.

In general, it is difficult for a monolithic IC to incorporate passive components; however, it is possible for the monolithic IC to incorporate active components. Accordingly, if the integration circuit, formed with operational amplifiers, the comparator circuit, and the analog switches are collected as active components, then the watthour meter can be provided in the form of a monolithic IC.

Figure 24:
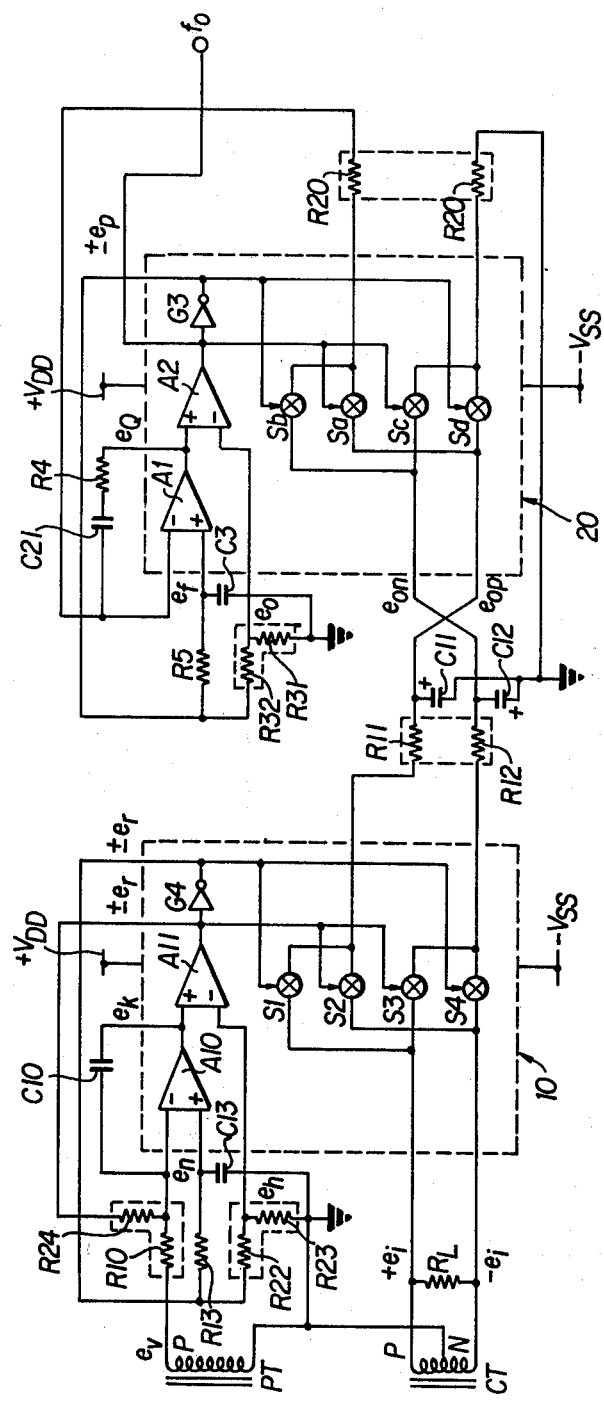
FIG. 24 is a circuit diagram, partly as a block diagram, showing another example of the electric watthour meter according to the invention, which can be manufactured in the form of an integrated circuit.

FIG. 24 shows one example of the watthour meter in the form of an integrated circuit (IC). In FIG. 24, a multiplication circuit section 10 including a pulse width modulation circuit (indicated by the broken line) is equal in arrangement to a frequency conversion section 20 adapted to subject the voltages $e_{op}$ and $e_{on}$ to frequency conversion after the multiplication. In FIG. 24, those components which have been previously described with reference to FIGS. 5 and 16 have therefore been similarly numbered, and their operations are also similar to those described before. Switches Sc and Sd are additionally provided in the frequency conversion section 20. The switches Sc and Sd are to make the load resistance R20, as viewed from the DC voltage signals $e_{op}$ and $e_{on}$, constant with the resistance R20, irrespective of the on-off operations of the switches Sa through Sd. More specifically, the resistor R20, having the same value as the input resistance of the integration circuit A1, is connected to the common connection of the analog switches Sc and Sd. The circuitry shown in FIG. 24 can be obtained by providing two IC's equal in construction, which leads to reduction of the delivery data and to reduction of the manufacturing cost, and which facilitates inspection and maintenance. In order to operate the watthour meter shown in FIG. 24 with high precision, the above-described electric source unit shown in FIG. 23 should be used.

The invention has been described with reference to the single-phase two-line type watthour meter. However, it should be noted that if a plurality of signal detection sections, including transformers PT and current transformers CT, and a plurality of multiplication circuit sections 10 are provided, then the invention can be applied to a polyphase watthour meter.

Figure 25:
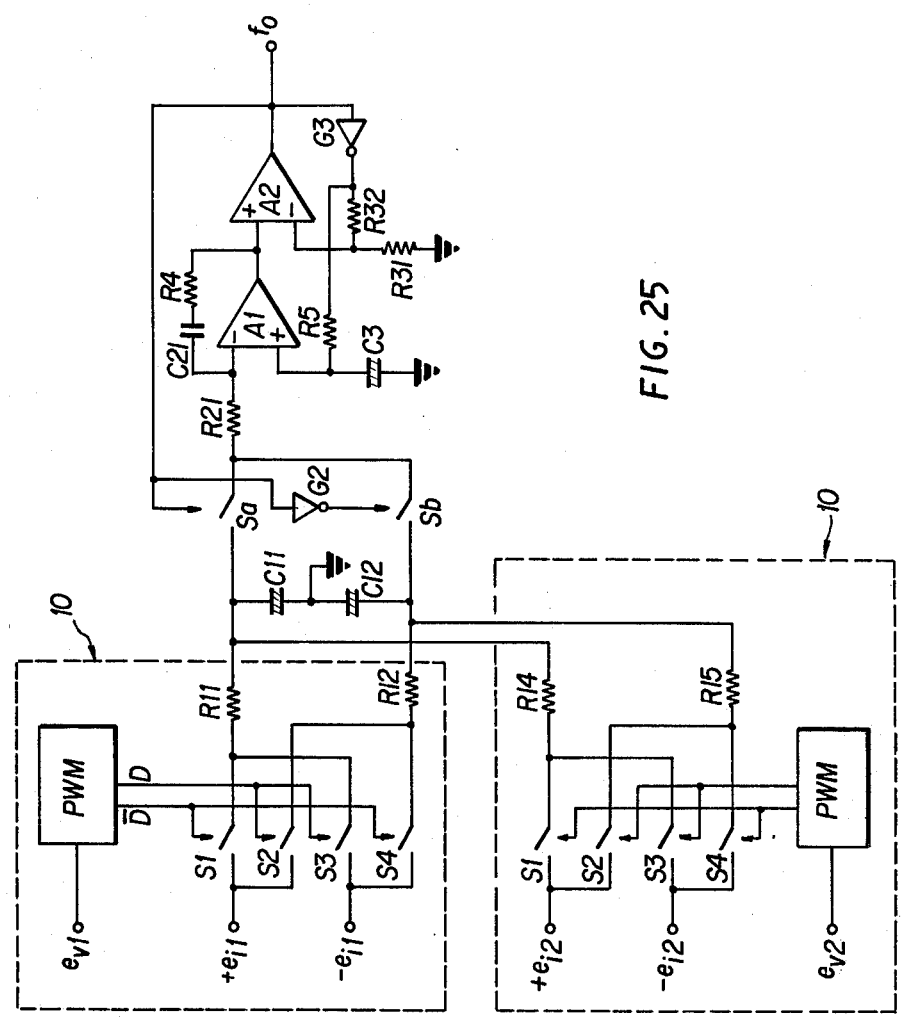
FIG. 25 is a circuit diagram, partly as a block diagram, showing one modification of the electric watthour meter according to the invention, which is a polyphase watthour meter.

FIG. 25 shows one example of a polyphase watthour meter according to the invention. In this polyphase watthour meter, the electrical energy is the sum of the powers of the phases.

$$P_o = e_{v1} \cdot e_{i1} + e_{v2} \cdot e_{i2} + e_{vn} \cdot e_{in} \tag{35}$$

In this case, the voltage signals $e_i$, proportional to the consumption currents of the corresponding phases, are switched by the analog switches S1 through S4 with the aid of the pulse width duty cycle signals D and $\bar{D}$, of the pulse width modulation circuit, so that the signals, subjected to multiplication, respectively, for the phases, are added by the low-pass filters. As a result, the power $P_o$ satisfying the equation (35) can be obtained. In the above-described polyphase watthour meter also, the multiplication circuit section 10, including the pulse width modulation circuit, can be formed as one IC for every phase. As the frequency conversion section 20 can be used commonly for all the phases, the polyphase watthour meter is similar to the single-phase watthour meter.

In the above-described example, the voltage signal $e_V$ is applied to the pulse width modulation circuit, and the voltage signal $e_i$ is applied to the multiplication circuit; however, it is obvious that the voltage signal $e_V$ may be applied to the multiplication circuit and the voltage signal $e_i$ may be applied to the pulse width modulation circuit.

As is clear from the above description, according to the invention, in the pulse width modulation circuit, having the integration circuit and the comparator circuit made up of operational amplifiers, the offset voltage is caused by the operational amplifiers; however, the offset voltage can be cancelled by applying a voltage equal to the offset voltage to the input of the operational amplifier by means of the low-pass filter provided in the feedback system. Accordingly, the pulse width modulation circuit can be formed with general purpose operational amplifiers low in cost, and the pulse width duty cycle signals can be obtained with high accuracy, without externally adjusting the offset voltage. In the low-pass filter, the feedback is effected with the time constant provided by the resistor and the capacitor. Therefore, even if the offset voltage is changed with time or changed by temperature variations, the low-pass filter is automatically adjusted to follow the variations of the offset voltage. Thus, the watthour meter according to the invention can operate stably for a long period of time.

The frequency conversion section is also made up of the integration circuit and the comparator circuit which comprises the operational amplifiers, thus having the same effects as described above.

The output circuit of the comparator circuit in each of the pulse width modulation circuit and the frequency conversion section is made up of the P-channel C-MOS field-effect transistor and the N-channel C-MOS field-effect transistor, thus eliminating the fluctuation of the positive and negative output voltages which, as in the prior art, is involved in a bipolar IC or a clamp diode. That is, since a C-MOS type field-effect transistor is a voltage-controlled element, the difference between the "on" resistance and the "off" resistance thereof is considerably large, and therefore the C-MOS field-effect transistor can serve as a complete switching circuit. This principle can be applied not only to the integration circuit but also to the inverter circuit in the frequency conversion section.

In order to obtain the positive and negative supply voltages, the operational amplifier, whose output impedance is zero with the infinite input impedance, is connected to the voltage division resistance circuit in the output circuit of one regulator, as a result of which the correctly positive and negative electric sources are obtained. Furthermore, according to the invention, the multiplication circuit, including the pulse width modulation circuit, is equal in construction to the frequency conversion section, and the multiplication circuit and the frequency conversion section are formed with active components. Therefore, these circuits are suitably manufactured in the form of an integrated circuit, with the result that the size of the electronic watthour meter is minimized.

What is claimed as new and desired to be secured by Letters Patent of the United States is:

1. An electronic watthour meter for measuring the instantaneous power of a supply line by multiplying a first voltage signal proportional to the load voltage of said power line and a second voltage signal proportional to the consumption current of said line, comprising:
- a pulse width modulation circuit controlled by said first voltage signal for producing pulse wave modulated signals proportional to the amplitude of said first signal in order to provide a voltage pulse width duty cycle signal;
- a multiplication circuit having a plurality of analog switches which are selectively operated by said pulse width duty cycle signal from said pulse width modulation circuit so that positive and negative DC voltages, equal in absolute value, are obtained which represent the product of said second voltage signal and said first voltage signal;
- a frequency conversion circuit for converting said positive and negative DC voltages into a frequency signal.

2. An electronic watthour meter as claimed in claim 1, in which said pulse width modulation circuit comprises: an integration circuit having an operational amplifier in which said first voltage signal, proportional to said load voltage, is applied to the negative input thereof for addition integration; and a comparator circuit whose polarity is inverted whenever the integration output voltage of said integration circuit reaches a predetermined value.

3. An electronic watthour meter as claimed in claim 2, further including a low-pass filter for applying the output signal of said comparator circuit to the positive input of said integration circuit to eliminate an offset voltage developed by said integration circuit.

4. An electronic watthour meter as claimed in claim 1, in which said multiplication circuit comprises two sets of low-pass filters provided in the output circuit of said analog switches.

5. An electronic watthour meter as claimed in claim 1, in which said frequency conversion circuit comprises an integration circuit for integrating said positive and negative DC voltages from said multiplication circuit; and a comparator circuit whose polarity is inverted whenever the output voltage of said integration circuit reaches a predetermined value.

6. An electronic watthour meter as claimed in claim 5, further including a low-pass filter for applying the output signal of said comparator circuit to the positive input of said integration circuit to eliminate an offset voltage developed by said integration circuit.

7. An electronic watthour meter as claimed in claim 5, further including a correcting resistor connected in series to a capacitor defining the integration time constant of said integration circuit, said correcting resistor adapted to improve integration output voltage nonlinearity attributing to said positive and negative voltages applied to said integration circuit.

8. An electronic watthour meter as claimed in claim 6, further including a correcting resistor connected in series to a capacitor defining the integration time constant of said integration circuit, said correcting resistor adapted to improve integration output voltage nonlinearity attributing to said positive and negative voltages applied to said integration circuit.

9. An electronic watthour meter as claimed in claim 5, including another integration circuit to the negative input of which the output signal of said comparator circuit is applied, the integration output of said another integration circuit being fed back to the negative input of said integration circuit.

10. An electronic watthour meter as claimed in claim 1, wherein each of the output circuits of said comparator circuits of said pulse width modulation circuit and said frequency conversion circuit comprises switching means made up of a P-channel C-MOS type field-effect transistor and an N-channel C-MOS type field-effect transistor connected to positive and negative electric source circuits.

11. An electronic watthour meter as claimed in claim 1, in which said multiplication circuit, including said pulse width modulation circuit, is formed with an assembly of active components and externally connected passive components, and said frequency conversion circuit is formed with an assembly of active components and externally connected passive components, said assemblies of active components being equal in construction to each other for common use.

12. An electronic watthour meter as claimed in claim 1, in which a plurality of pulse width modulation circuits and a plurality of multiplication circuits are provided, and the output voltages of said plurality of multiplication circuits are subjected to addition separately according to the positive and negative polarities to provide addition results, which are applied to one frequency conversion section thereby to obtain a polyphase electrical energy value.

* * * * *